(12) United States Patent
Fukumochi et al.

(10) Patent No.: US 9,368,665 B2
(45) Date of Patent: Jun. 14, 2016

(54) SOLAR CELL MODULE

(71) Applicant: SANYO Electric Co., Ltd., Osaka (JP)

(72) Inventors: Shuji Fukumochi, Shiga (JP);
Masayoshi Ono, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/534,479

(22) Filed: Nov. 6, 2014

(65) Prior Publication Data

US 2015/0059831 A1 Mar. 5, 2015

Related U.S. Application Data

(63) Continuation of application No. PCT/JP2013/062412, filed on Apr. 26, 2013.

(30) Foreign Application Priority Data

May 9, 2012 (JP) .................................. 2012-107228

(51) Int. Cl.
| | | |
|---|---|---|
| H01L 31/0232 | (2014.01) | |
| H01L 31/0224 | (2006.01) | |
| H01L 31/054 | (2014.01) | |
| H01L 31/048 | (2014.01) | |
| H01L 31/05 | (2014.01) | |

(52) U.S. Cl.
CPC .......... *H01L 31/0547* (2014.12); *H01L 31/048* (2013.01); *H01L 31/0508* (2013.01); *H01L 31/0516* (2013.01); *Y02E 10/52* (2013.01)

(58) Field of Classification Search
CPC .............. H01L 31/048; H01L 31/0543; H01L 31/0547; H01L 31/054; H01L 31/0516; H01L 31/05; H01L 31/0504; H01L 31/0518
USPC .......................................................... 136/256
See application file for complete search history.

(56) References Cited

U.S. PATENT DOCUMENTS

| | | | | |
|---|---|---|---|---|
| 5,994,641 A | * | 11/1999 | Kardauskas | ................... 136/246 |
| 6,323,415 B1 | * | 11/2001 | Uematsu et al. | ............... 136/246 |
| 2005/0126619 A1 | * | 6/2005 | Abe et al. | ....................... 136/244 |

FOREIGN PATENT DOCUMENTS

JP 2012-033591 A 2/2012

* cited by examiner

*Primary Examiner* — Jayne Mershon
(74) *Attorney, Agent, or Firm* — Mots Law, PLLC

(57) ABSTRACT

A solar cell module includes multiple rectangular solar cells each with chamfered corner portions, wiring members each electrically connecting adjacent ones of the solar cells to each other, and a protective member on a light-receiving surface side of the solar cells. The solar cells are arranged in matrix with spaces therebetween. The wiring member has a reflective surface in a region surrounded by the corner portions of the multiple solar cells. The reflective surface reflects light entering from the light-receiving surface side toward the protective member.

18 Claims, 4 Drawing Sheets

SOLAR CELL MODULE

CROSS REFERENCE TO RELATED APPLICATIONS

This application is a continuation application of International Application No. PCT/JP2013/062412, filed on Apr. 26, 2013, entitled "SOLAR CELL MODULE", which claims priority based on Article 8 of Patent Cooperation Treaty from prior Japanese Patent Application No. 2012-107228, filed on May 9, 2012, entitled "SOLAR CELL MODULE", the entire contents of which are incorporated herein by reference.

BACKGROUND

The disclosure relates to a solar cell module.
There is known a solar cell module having multiple solar cells arranged in matrix with spaces therebetween (e.g., Patent Document 1).
Patent Document 1: Japanese Patent Application Publication No. 2012-33591

SUMMARY OF THE INVENTION

There are demands that such a solar cell module have improved output characteristics.

One aspect of the invention provides a solar cell module with improved photoelectric conversion efficiency.

A solar cell module according to an embodiment includes multiple rectangular solar cells each with chamfered corner portions, wiring members, and a protective member. The solar cells are arranged in matrix with spaces therebetween. The wiring members each electrically connect adjacent ones of the solar cells to each other. The protective member is arranged at a light-receiving surface side of the solar cells. The wiring member has a reflective surface. The reflective surface is located in a region surrounded by the corner portions of the multiple solar cells. The reflective surface is configured to reflect light entering from the light-receiving surface side toward the protective member.

The embodiment above can provide a solar cell module with improved photoelectric conversion efficiency.

EMBODIMENTS

Figure 1:
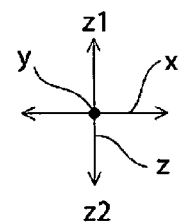
FIG. 1 is a schematic sectional view of a solar cell module according to one embodiment.
Figure 1:
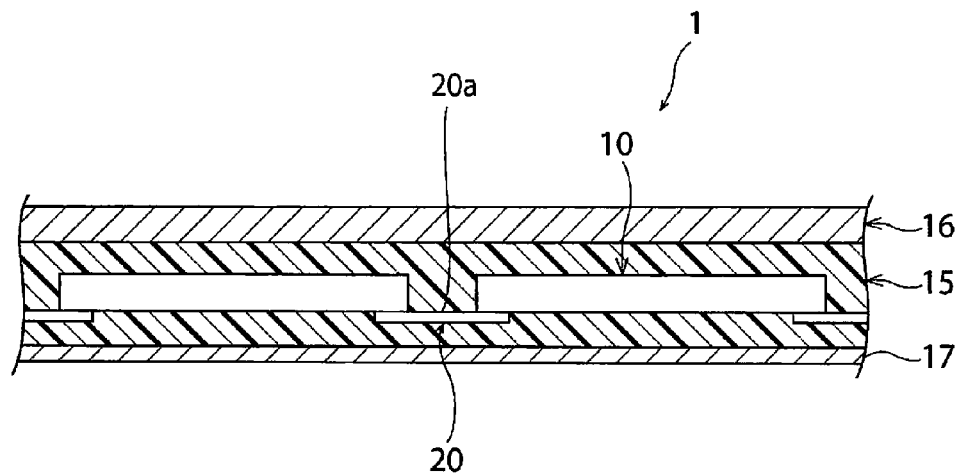

Hereinafter, examples of preferred embodiments are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

As illustrated in FIGS. 1 to 4, solar cell module 1 includes multiple solar cells 10. Solar cells 10 are arranged in matrix with spaces therebetween in an x-axis direction and a y-axis direction, which is perpendicular to the x-axis direction.

Figure 2:
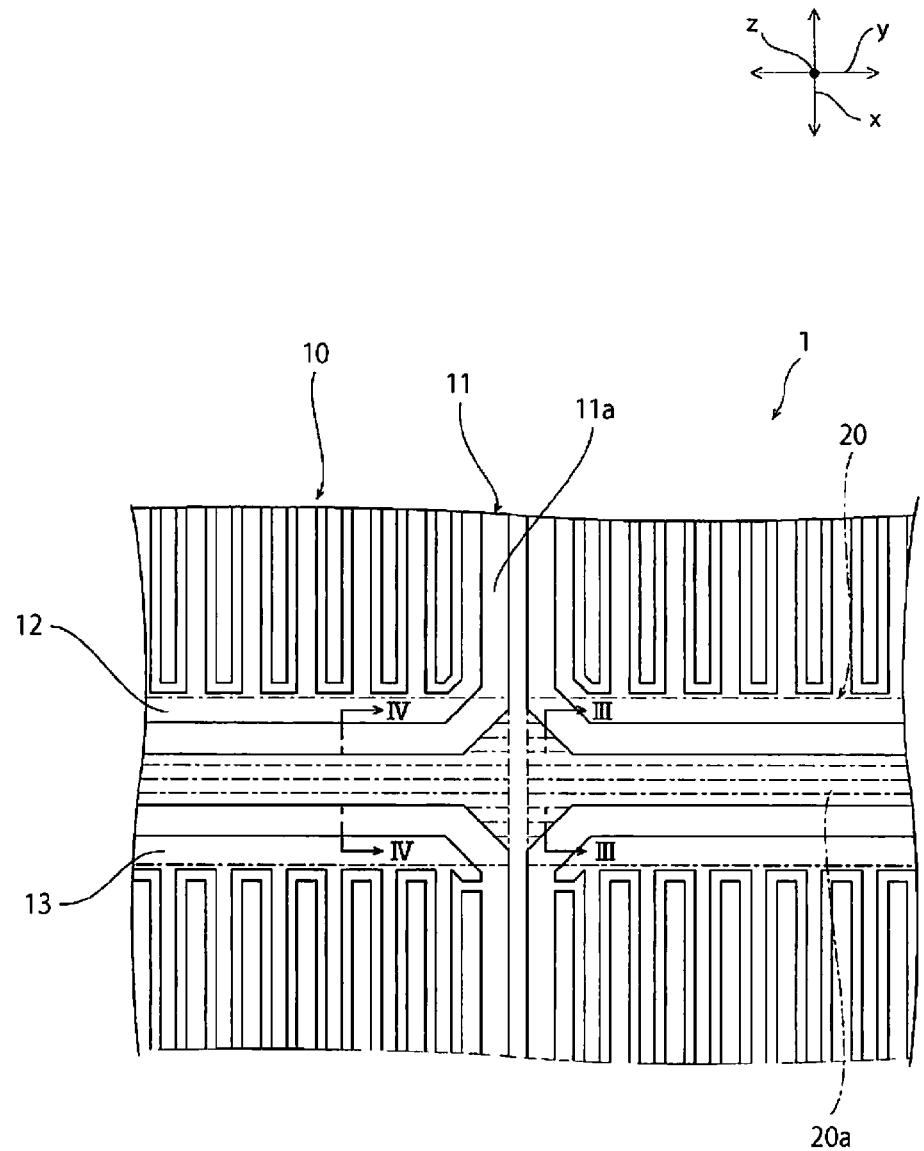
FIG. 2 is a schematic diagram illustrating the rear surface of the solar cell module according to the embodiment, the diagram omitting illustration of protective members and a filler layer.

Each solar cell 10 has a rectangular shape with chamfered corner portions, i.e., substantially an octagonal shape. Thus, as illustrated in FIG. 2, a rectangular region having no solar cell 10 is defined by the corners of four solar cells 10. Specifically, solar cell 10 is formed in square with chamfered corner portions, and a square region having no solar cell 10 is defined by the corner portions of four of such solar cells 10.

Figure 3:
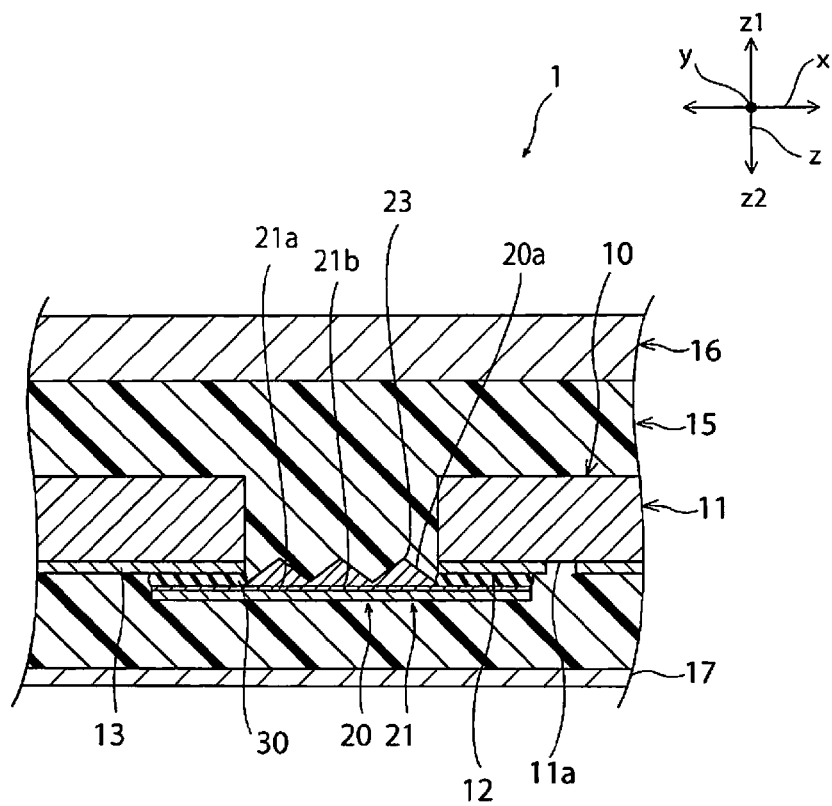
FIG. 3 is a schematic sectional diagram taken along line III-III in FIG. 2.
Figure 4:
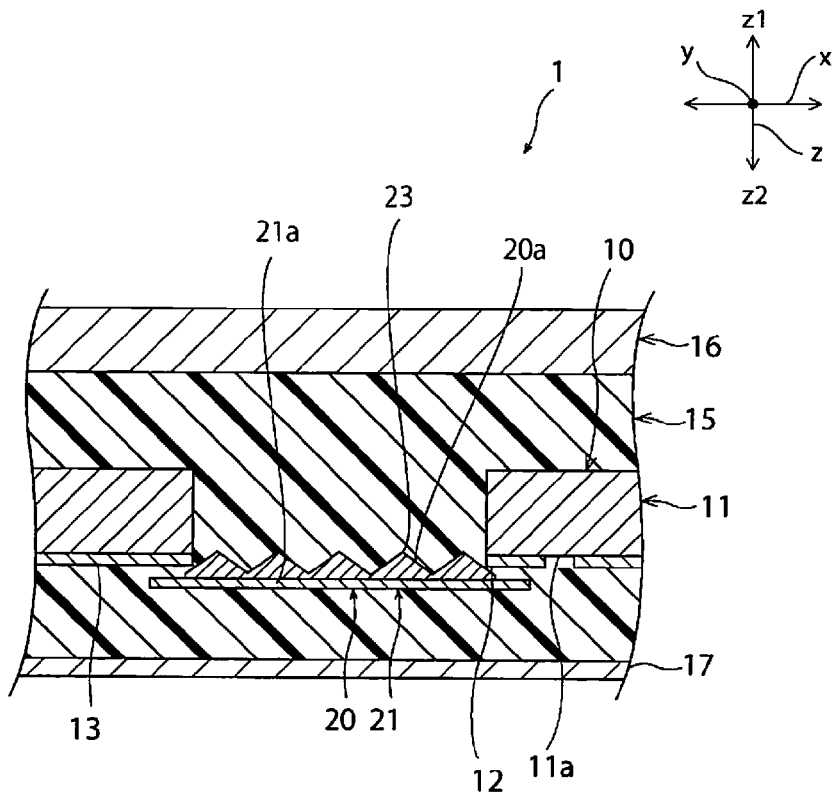
FIG. 4 is a schematic sectional diagram taken along line IV-IV in FIG. 2.

As illustrated in FIGS. 2 to 4, each solar cell 10 includes photoelectric conversion body 11 configured to generate carriers such as electrons and holes upon reception of light, first electrode 12 configured to collect minority carriers, and second electrode 13 configured to collect majority carriers. First and second electrodes 12 and 13 are both provided on rear surface 11a of photoelectric conversion body 11. In other words, solar cell 10 is a back contact solar cell. Photoelectric conversion body 11 can be formed of a crystal semiconductor substrate, which is for example a crystal silicon substrate, and p-type and n-type semiconductor layers placed on one main surface of the crystal semiconductor substrate. Photoelectric conversion body 11 can also be formed of a crystal semiconductor substrate having a p-type dopant diffusion region and an n-type dopant diffusion region provided and exposed on one main surface of the crystal semiconductor substrate.

Solar cells 10 are electrically connected to each other by wiring member 20. Specifically, solar cells 10 arranged in the x-axis direction are connected with wiring member 20 to form a solar cell string. Solar cell strings being adjacent in the y-axis direction are further electrically connected with a wiring member. Wiring member 20 is bonded to solar cells 10 with adhesive layer 30 illustrated in FIG. 3. For example, adhesive layer 30 can be formed from a hardened resin adhesive, a hardened resin adhesive containing conductive member, solder, or the like.

As illustrated in FIGS. 1, 3, and 4, first protective member 16 is placed on the light-receiving surface side (z1 side) of solar cells 10. First protective member 16 can be formed of, for example, a glass plate or a ceramic plate.

Second protective member 17 is placed on the back-surface side (z2 side) of solar cells 10. Second protective member 17 can be formed of, for example, a resin sheet, a resin sheet having a barrier layer such as a metal layer, or the like.

Bonding layer 15 is provided between first protective member 16 and second protective member 17. Solar cells 10 are sealed by this bonding layer 15. Bonding layer 15 can be formed from, for example, a crosslinkable resin such as an ethylene-vinyl acetate copolymer (EVA) resin or a non-crosslinkable resin such as a polyolefin resin.

As illustrated in FIG. 2, wiring member 20 is provided in such a manner as to cover at least part of the region surrounded by the corner portions of four solar cells 10. Wiring member 20 has reflective surface 20a located in the region surrounded by the corner portions of four solar cells 10.

Reflective surface 20a reflects light entering from the light-receiving surface side toward first protective member 16. Thus, at least part of the light entering the region surrounded by the corner portions of four solar cells 10 is reflected by reflective surface 20a and is once again reflected by first protective member 16 toward solar cells 10. Hence, the rate of contribution to power generation by the light entering the region surrounded by the corner portions of four solar cells 10 can be increased. As a result, photoelectric conversion efficiency can be improved.

Further, in solar cell module 1, reflective surface 20a is also provided between solar cells 10 adjacent in x-axis direction. For this reason, the efficiency of using light entering the space between solar cells 10 adjacent in the x-axis direction can also be increased. Hence, photoelectric conversion efficiency can be improved even more.

To be more specific, as illustrated in FIGS. 3 and 4, wiring member 20 in this embodiment has wiring-member main body 21 configured to electrically connect adjacent solar cells 10 and reflective member 23. Wiring-member main body 21 has resin sheet 21a and conductive layer 21b. Conductive layer 21b is provided on a surface of resin sheet 21a on the solar cell 10 side. Solar cells 10 adjacent in the x-axis direction are electrically connected to each other via this conductive layer 21b.

Reflective member 23 is placed on a surface of wiring-member main body 21 on the solar cell 10 side. Reflective member 23 forms reflective surface 20a. Such placement of reflective member 23 forming reflective surface 20a on wiring-member main body 21 facilitates provision of reflective surface 20a, and therefore, facilitates manufacturing of solar cell module 1.

Since reflective member 23 is provided separately from conductive layer 21b, the degree of freedom for selecting the material for reflective member 23 improves, allowing reflective member 23 to be made of a material with high light reflectance. Thus, the output characteristics of solar cell module 1 may be improved even more. For example, reflective member 23 is preferably made of at least one metal selected from the group consisting of Ag, Al, and Cu.

Figure 5:
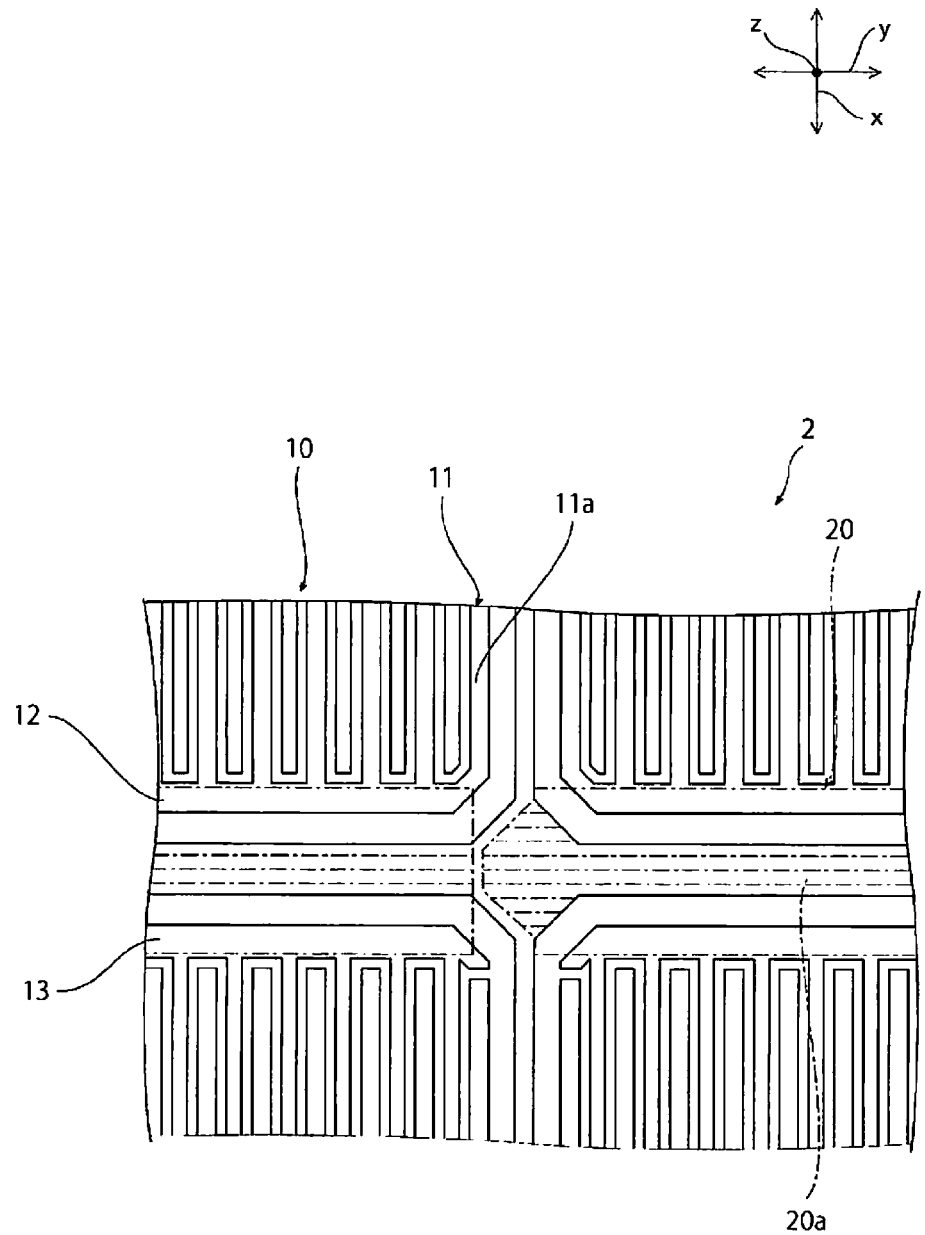
FIG. 5 is a schematic diagram illustrating the rear surface of a solar cell module according to a modification, the diagram omitting illustration of protective members and a filler layer.

In all wiring members 20 of solar cell module 1, reflective surface 20a extends over to both of a region surrounded by corner portions (called "corner-surrounded region" below) located on one side of wiring members 20 in the y-axis direction and a corner-surrounded region located on the other side of the wiring members 20 in the y-axis direction. However, the invention is not limited to such a configuration. For example, as a solar cell module 2 illustrated in FIG. 5, wiring member 20 having reflective surface 20a which extends over to the corner-surrounded region on the one side in the y-axis direction but does not extend over to the corner-surrounded region on the other side in the y-axis direction may be provided in the y-axis direction. Alternatively, wiring member 20 having reflective surface 20a extending over to both of the corner-surrounded regions on the one side and the other side in the y-axis direction and wiring member 20 having reflective surface 20a extending over to neither of the corner-surrounded regions on the one side and the other side in the y-axis direction may be provided alternately in the y-axis direction. It is preferable in these cases that the tip of a protrusion portion of reflective surface 20a protruding to the corner-surrounded region be chamfered or rounded.

Moreover, reflective members 23 of wiring members 20 adjacent in the y-axis direction may be integral with each other. In other words, reflective member 23 may be provided to extend over multiple solar cell strings.

Furthermore, wiring members 20 adjacent in the y-axis direction may be integral with each other, including their wiring-member main bodies 21. In other words, entire wiring member 20 may be provided to extend over multiple solar cell strings.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
a plurality of rectangular solar cells each with chamfered corner portions, the solar cells being arranged in matrix with spaces there between, the solar cells including a first solar cell, a second solar cell adjacent to the first solar cell in a first direction and a third solar cell adjacent to the first solar cell in a second direction orthogonal to the first direction;
a wiring member electrically connecting the first and second solar cells adjacent to each other; and
a protective member arranged at a light-receiving surface side of the solar cells, wherein
the wiring member has a reflective surface that is located in a corner-surrounded region surrounded by the chamfered corner portions of the first, second and third solar cells, and the reflective surface is configured to reflect light entering from the light-receiving surface side toward the protective member,
wherein
the reflective surface extends over to the corner-surrounded region surrounded by the chamfered corner portions of the first, second and third solar cells on a first side in the second direction.

2. The solar cell module according to claim 1, wherein the solar cell includes
a photoelectric conversion body, and
first and second electrodes placed on one main surface of the photoelectric conversion body.

3. The solar cell module according to claim 2, wherein the wiring member includes a protrusion portion protruding to the corner-surrounded region surrounded by the chamfered corner portions of the first, second and third solar cells.

4. The solar cell module according to claim 2, wherein the wiring members each include
a wiring-member main body electrically connecting the solar cells adjacent in the first direction, and
a reflective member provided on the wiring-member main body and forming the reflective surface, and
the reflective member of one of the wiring members and the reflective member of another one of the wiring members which is adjacent to the one wiring member in the second direction are provided integrally.

5. The solar cell module according to claim 2, wherein the wiring members each include
a wiring-member main body electrically connecting the solar cells adjacent in the first direction, and
a reflective member provided on the wiring-member main body and forming the reflective surface, and one of the wiring members and another one of the wiring members which is adjacent to the one wiring member in the second are provided integrally, including their wiring-member main bodies.

6. The solar cell module according to claim 1, wherein the wiring member includes a protrusion portion protruding to the corner-surrounded region surrounded by the chamfered corner portions of the first, second and third solar cells.

7. The solar cell module according to claim 1, wherein the wiring members each include
a wiring-member main body electrically connecting the solar cells adjacent in the first direction, and
a reflective member provided on the wiring-member main body and forming the reflective surface, and
the reflective member of one of the wiring members and the reflective member of another one of the wiring members which is adjacent to the one wiring member in the second direction are provided integrally.

8. The solar cell module according to claim 1, wherein the reflective surface does not extend over to the corner-surrounded region surrounded by the chamfered corner portions of the first, second and third solar cells on a second side in the second direction.

9. The solar cell module according to claim 1, wherein the wiring members each include
a wiring-member main body electrically connecting the solar cells adjacent in the first direction, and
a reflective member provided on the wiring-member main body and forming the reflective surface, and
one of the wiring members and another one of the wiring members which is adjacent to the one wiring member in the second direction are provided integrally, including their wiring-member main bodies.

10. A solar cell module comprising:
a plurality of rectangular solar cells each with chamfered corner portions, the solar cells being arranged in matrix with spaces there between, the solar cells including a first solar cell, a second solar cell adjacent to the first solar cell in a first direction and a third solar cell adjacent to the first solar cell in a second direction orthogonal to the first direction;
a wiring member electrically connecting the first and second solar cells adjacent to each other; and
a protective member arranged at a light-receiving surface side of the solar cells, wherein
the wiring member has a reflective surface that is located in a corner-surrounded region surrounded by the chamfered corner portions of the first, second and third solar cells,
the reflective surface is configured to reflect light entering from the light-receiving surface side toward the protective member, and extends over to the corner-surrounded region surrounded by the chamfered corner portions of the first, second and third solar cells on a first side in the second direction,
and wherein
the wiring member includes a resin sheet, and a conductive layer on a surface of the resin sheet on a side of the solar cells.

11. The solar cell module according to claim 10, wherein the solar cell includes
a photoelectric conversion body, and
first and second electrodes placed on one main surface of the photoelectric conversion body.

12. The solar cell module according to claim 11, wherein the wiring member includes a protrusion portion protruding to the corner-surrounded region surrounded by the chamfered corner portions of the first, second and third solar cells.

13. The solar cell module according to claim 11, wherein the wiring members each include
a wiring-member main body electrically connecting the solar cells adjacent in the first direction, and
a reflective member provided on the wiring-member main body and forming the reflective surface, and
the reflective member of one of the wiring members and the reflective member of another one of the wiring members which is adjacent to the one wiring member in the second direction are provided integrally.

14. The solar cell module according to claim 11, wherein the wiring members each include
a wiring-member main body electrically connecting the solar cells adjacent in the first direction, and
a reflective member provided on the wiring-member main body and forming the reflective surface, and
one of the wiring members and another one of the wiring members which is adjacent to the one wiring member in the second are provided integrally, including their wiring-member main bodies.

15. The solar cell module according to claim 10, wherein the wiring member includes a protrusion portion protruding to the corner-surrounded region surrounded by the chamfered corner portions of the first, second and third solar cells.

16. The solar cell module according to claim 10, wherein the wiring members each include
a wiring-member main body electrically connecting the solar cells adjacent in the first direction, and
a reflective member provided on the wiring-member main body and forming the reflective surface, and
the reflective member of one of the wiring members and the reflective member of another one of the wiring members which is adjacent to the one wiring member in the second direction are provided integrally.

17. The solar cell module according to claim 10, wherein the reflective surface does not extend over to another corner-surrounded region surrounded by at least the first and second solar cells on a second side in the second direction.

18. The solar cell module according to claim 10, wherein the wiring members each include
a wiring-member main body electrically connecting the solar cells adjacent in the first direction, and
a reflective member provided on the wiring-member main body and forming the reflective surface, and
one of the wiring members and another one of the wiring members which is adjacent to the one wiring member in the second direction are provided integrally, including their wiring-member main bodies.

* * * * *